US008703543B2

(12) United States Patent
Wan et al.

(10) Patent No.: US 8,703,543 B2
(45) Date of Patent: Apr. 22, 2014

(54) VERTICAL SENSOR ASSEMBLY METHOD

(75) Inventors: Hong Wan, Plymouth, MN (US); Ryan W. Rieger, Brooklyn Center, MN (US); Michael J. Bohlinger, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 341 days.

(21) Appl. No.: 12/502,712

(22) Filed: Jul. 14, 2009

(65) Prior Publication Data
US 2011/0012213 A1   Jan. 20, 2011

(51) Int. Cl.
H01L 23/488 (2006.01)
H01L 21/768 (2006.01)
H01B 5/00 (2006.01)
H01L 23/498 (2006.01)

(52) U.S. Cl.
USPC ............ 438/121; 257/692; 257/E21.575; 257/E23.068; 257/E23.023; 257/417

(58) Field of Classification Search
USPC ............ 257/692, E21.575, E23.023, E23.068
See application file for complete search history.

(56) References Cited

U.S. PATENT DOCUMENTS

| 4,090,231 A * | 5/1978 | Millard et al. ............... 361/529 |
| 4,266,282 A | 5/1981 | Henle et al. |
| 5,362,986 A | 11/1994 | Angiulli et al. |
| 5,444,294 A | 8/1995 | Suzuki |
| 5,451,815 A | 9/1995 | Taniguchi et al. |
| 6,077,725 A * | 6/2000 | Degani et al. ............... 438/108 |
| 6,140,696 A | 10/2000 | Kinsman |
| 6,169,254 B1 | 1/2001 | Pant et al. |
| 6,398,164 B1 * | 6/2002 | Fasse ........................ 244/118.6 |
| 6,417,024 B2 | 7/2002 | Kinsman |
| 6,453,550 B1 | 9/2002 | Farnworth et al. |

(Continued)

FOREIGN PATENT DOCUMENTS

| JP | S62016535 | 1/1987 |
| JP | H07066371 | 3/1995 |
| JP | H07115227 | 5/1995 |
| JP | H10002945 | 1/1998 |

OTHER PUBLICATIONS

European Patent Office, "European Search Report", from Foreign Counterpart of U.S. Appl. No. 12/502,712, Oct. 25, 2013, pp. 1-3, Published in: EP.

(Continued)

*Primary Examiner* — Lex Malsawma
*Assistant Examiner* — Sheng Zhu
(74) *Attorney, Agent, or Firm* — Fogg & Powers LLC

(57) ABSTRACT

A method to vertically bond a chip to a substrate is provided. The method includes forming a metal bar having a linear aspect on the substrate, forming a solder paste layer over the metal bar to form a solder bar, forming a plurality of metal pads on the substrate, and forming a solder paste layer over the plurality of metal pads to form a plurality of solder pads on the substrate. Each of the plurality of solder pads is offset from a long edge the solder bar by an offset-spacing. The chip to be vertically bonded to the substrate has a vertical-chip thickness fractionally less than the offset-spacing. The chip to be vertically bonded fits between the plurality of solder pads and the solder bar. The solder bar enables alignment of the chip to be vertically bonded.

10 Claims, 8 Drawing Sheets

(56) References Cited

U.S. PATENT DOCUMENTS

| | | | |
|---|---|---|---|
| 6,800,942 B1 * | 10/2004 | Kinsman | 257/777 |
| 6,841,416 B2 * | 1/2005 | Yoon et al. | 438/106 |
| 6,870,261 B2 * | 3/2005 | Hu et al. | 257/724 |
| 7,050,303 B2 * | 5/2006 | Park et al. | 361/715 |
| 7,095,226 B2 | 8/2006 | Wan et al. | |
| 7,132,745 B2 * | 11/2006 | Goudarzi | 257/710 |
| 7,271,586 B2 * | 9/2007 | Bohlinger et al. | 324/247 |
| 7,282,789 B2 * | 10/2007 | Kinsman | 257/685 |
| 7,367,845 B2 | 5/2008 | Farnworth et al. | |
| 7,465,654 B2 * | 12/2008 | Chou et al. | 438/614 |
| 8,053,891 B2 * | 11/2011 | Feng et al. | 257/738 |
| 2004/0084211 A1 | 5/2004 | Fayfield | |
| 2005/0032274 A1 | 2/2005 | Kinsman | |
| 2005/0045697 A1 * | 3/2005 | Lacap et al. | 228/180.22 |
| 2005/0122100 A1 | 6/2005 | Wan et al. | |
| 2005/0122101 A1 | 6/2005 | Bohlinger et al. | |
| 2006/0253415 A1 | 11/2006 | Chakraborty et al. | |
| 2007/0052077 A1 | 3/2007 | Wathanawasam et al. | |
| 2009/0072823 A1 | 3/2009 | Wan et al. | |
| 2010/0272598 A1 * | 10/2010 | Kim et al. | 420/560 |

OTHER PUBLICATIONS

Japanese Patent Office, "Office Action from JP Application No. 2010-154775 mailed Jan. 28, 2014", "from Foreign Counterpart of U.S. Appl. No. 12/502,712", Jan. 28, 2014, pp. 1-5, Published in: JP.

European Patent Office, "Communication under Rule 71(3) from EP Application No. 10168299.5 mailed Feb. 18, 2014", "from Foreign Counterpart of U.S. Appl. No. 12/502,712", Feb. 18, 2014, pp. 1-7, Published in: EP.

* cited by examiner

VERTICAL SENSOR ASSEMBLY METHOD

BACKGROUND

Many physical parameters measured by sensors are vectors. In some cases, sensors are required to be orientated in three orthogonal directions to obtain critical information along three axes in space. Some of the sensors can be fabricated on a planar surface with three axes, while other have to be mounted on die or chips in three different orientations. It is difficult to mount a chip or die vertically.

SUMMARY OF INVENTION

The present application relates to a method to vertically bond a chip to a substrate. The method includes forming a metal bar having a linear aspect on the substrate, forming a solder paste layer over the metal bar to form a solder bar, forming a plurality of metal pads on the substrate, and forming a solder paste layer over the plurality of metal pads to form a plurality of solder pads on the substrate. Each of the plurality of solder pads is offset from a long edge the solder bar by an offset-spacing. The chip to be vertically bonded to the substrate has a vertical-chip thickness fractionally less than the offset-spacing. The chip to be vertically bonded fits between the plurality of solder pads and the solder bar. The solder bar enables alignment of the chip to be vertically bonded.

The details of various embodiments of the claimed invention are set forth in the accompanying drawings and the description below. Other features and advantages will become apparent from the description, the drawings, and the claims.

BRIEF DESCRIPTION OF THE DRAWINGS

The present invention can be more easily understood and further advantages and uses thereof more readily apparent, when considered in view of the detailed description and the following figures in which.

In accordance with common practice, the various described features are not drawn to scale but are drawn to emphasize specific features relevant to the present invention. Like reference characters denote like elements throughout Figures and text.

DETAILED DESCRIPTION

For the reasons stated above and for other reasons stated below which will become apparent to those skilled in the art upon reading and understanding the present specification, there is a need in the art for a method of bonding vertically orientated chips on a substrate. For example, a sensor that is sensitive along three axes can be packaged in a relatively flat configuration if the X and Y (horizontal) sensitive sensors are mounted parallel to the surface of a substrate and if the sensor that is sensitive in the vertical direction (Z axis) is long in the horizontal plane and relatively short in the Z direction.

Figure 1:
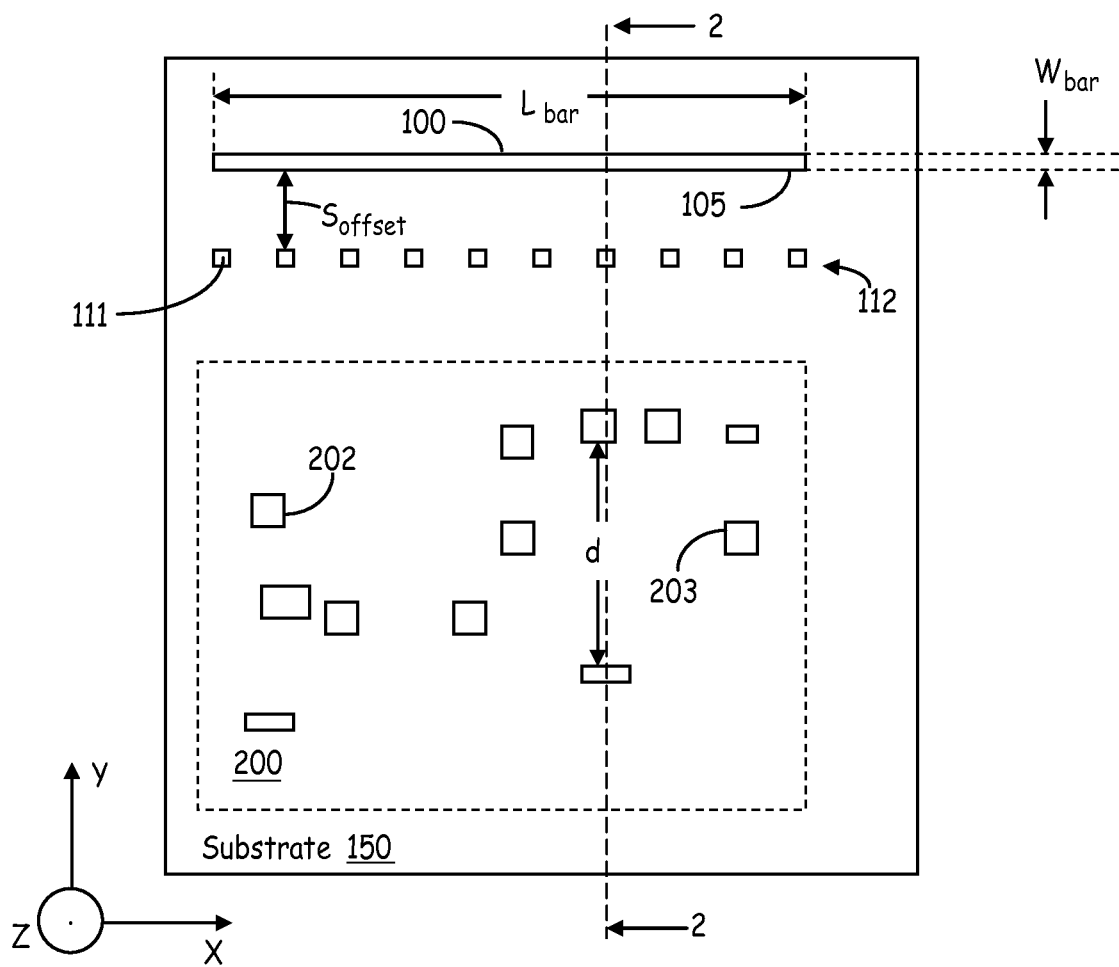
FIG. 1 is a top view of a substrate prepared in accordance with an embodiment of the present invention.
Figure 2A:
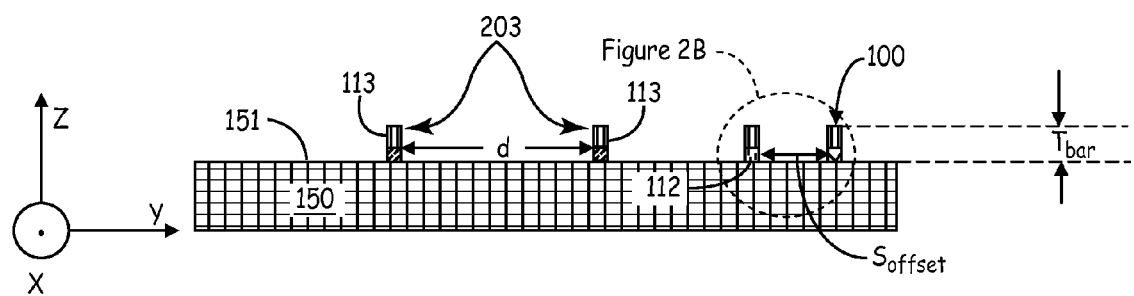
FIG. 2A is a cross-section view of the substrate of FIG. 1.
Figure 2B:
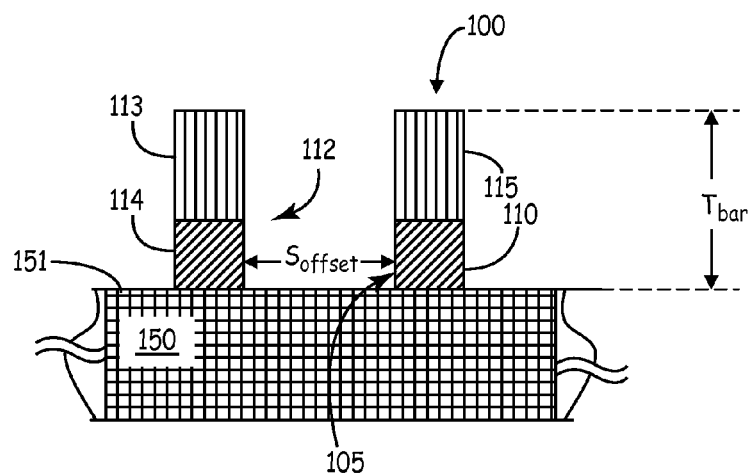
FIG. 2B is an enlarged side view of a portion of the substrate of FIG. 2A.

FIG. 1 is a top view of a substrate 150 prepared in accordance with an embodiment of the present invention. FIG. 2A is a cross-section view of the substrate 150 of FIG. 1. FIG. 2B is an enlarged side view of a portion of the substrate 150 of FIG. 2B. The plane upon which the cross-section view of FIG. 2A is taken is indicated by section line 2-2 in FIG. 1. A solder bar 100 and a first plurality of solder pads represented generally at 112 overlay a top surface 151 (FIGS. 2A and 2B) of the substrate 150. The solder bar 100 and the first plurality of solder pads 112 are used to align a vertically orientated chip in a vertical manner to the substrate 150. Once aligned, a reflow process is used to bond the first plurality of solder pads 112 to the vertically orientated chip in a vertical manner so that the required electrical connections are made for operation of the vertically orientated chip.

In one implementation of this embodiment, the vertically orientated chip is a sensor that measures forces in the vertical (Z) direction. In the embodiment shown in FIG. 1, a second plurality of solder pads represented generally at 202 and 203 are formed overlaying the top surface 151 in an area 200. The second plurality of solder pads 202 and 203 are used to bond at least one horizontally orientated chip to the substrate 150. The area 200 is the region for operably bonding to the substrate 150 one or more horizontally orientated chip that are sensitive to forces in one or more directions in the horizontal plane (i.e., a plane parallel to the top surface 151).

The solder bar 100 has a length $L_{bar}$, a width $W_{bar}$ (FIG. 1), and a thickness $T_{bar}$ (FIGS. 2A-2B). The length $L_{bar}$ of the solder bar 100 is much greater than the width $W_{bar}$ of the solder bar 100 and is much greater than the thickness $T_{bar}$ of the solder bar 100. Thus, the solder bar 100 has a linear aspect extending along the long edge 105 of length $L_{bar}$ of the solder bar 100. As defined herein, a feature having a linear aspect is a three-dimensional feature in which one dimension is much greater than the other two dimensions. In one implementation of this embodiment, the length $L_{bar}$ of the solder bar 100 is at least ten (10) times greater than each of the width $W_{bar}$ of the solder bar 100 and the thickness $T_{bar}$ of the solder bar 100. In another implementation of this embodiment, the length $L_{bar}$ of the solder bar 100 is at least twenty (20) times greater than the width $W_{bar}$ and the thickness $T_{bar}$ of the solder bar 100. Other configurations of linear aspects are possible.

The solder bar 100 includes a metal bar 110 (FIG. 2B) having a linear aspect that overlays the substrate 150 and a solder paste layer 115 (FIG. 2B) overlaying the metal bar 110. The first plurality of solder pads 112 each include a metal pad 114 that overlays the substrate 150 and a solder paste layer 114 overlaying the metal pads 114. The second plurality of solder pads 202 and 203 each include a metal pad 114 that overlays the substrate 150 and a solder paste layer 113 (FIG. 2A) overlaying the metal pads 114. In one implementation of this embodiment, the solder paste layers 115 and 113 are a layer of lead-free type 6 solder paste that is formed on the metal bar 110 and metal pads 114, respectively, during the same process. The lead-free type 6 solder paste provides the required reflow characteristics described below to provide an alignment process while bonding the vertically orientated chip in a vertical manner to the substrate 150 without tilting the vertically orientated chip.

The first plurality of solder pads 112 are arranged in a linear manner so that the solder pads 112 are each on the same side of the solder bar 100 and are each the same distance from the long edge 105 (FIG. 1) of the solder bar 100. The distance between the solder pads 112 and the long edge 105 of the solder bar 100 is $S_{offset}$. The long edge 105 that is closest to the solder pads 112 is also referred to herein as an "inner edge 105."

The substrate 150 is formed from any required material including laminate substrates, ceramic substrates, or semiconductor substrates, such as GaAs, Si, InP, $SiO_2$. The metal bar 110 is formed from metals that are appropriate for the type of solder used. For example, the metal bar 110 can be formed from gold, copper, tin, copper-tin, other metals, and other alloys. In one implementation of this embodiment, the thickness of the metal bar 110 and the metal pads 114 is about 15 microns and the thickness of the solder paste layers 115 and 113 are about 60 microns. The thickness of the solder bar 100 is about the thickness of the solder pads 112, 202, and 203 since they are formed at the same time.

Figure 3:
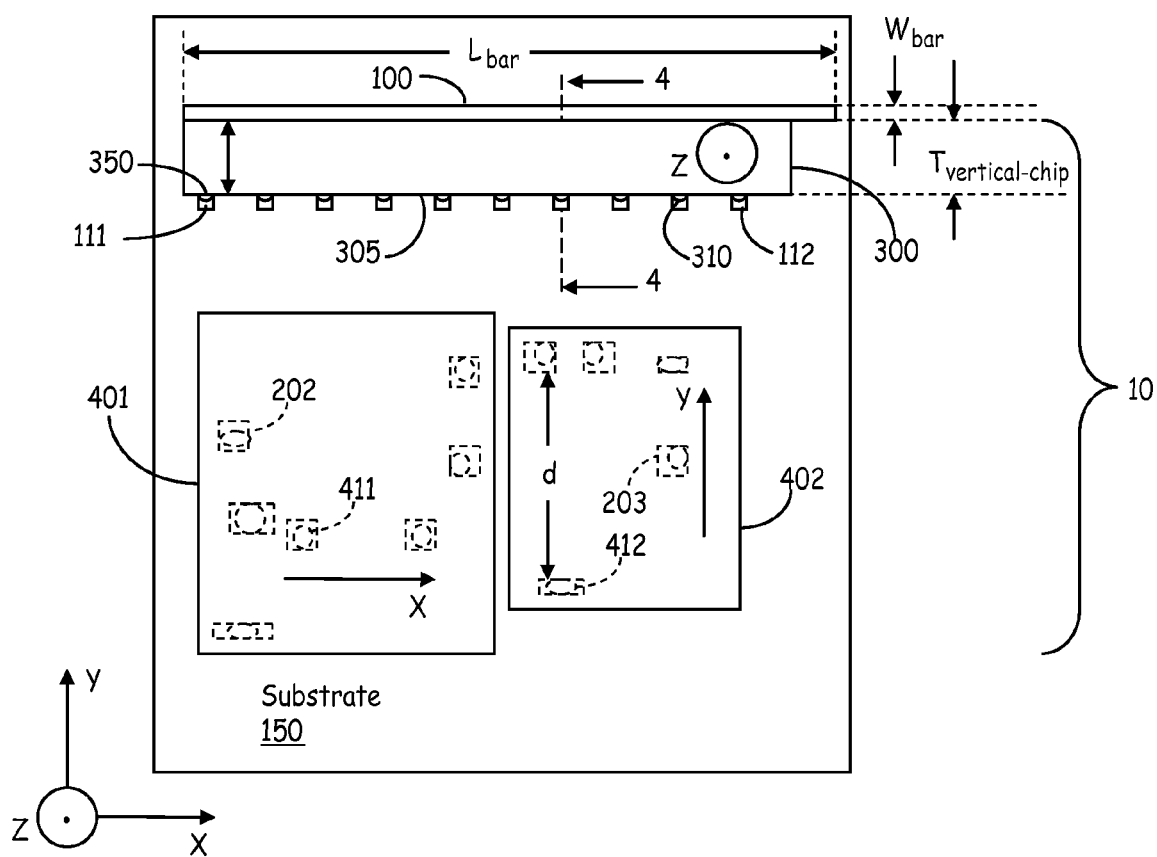
FIG. 3 is a top view of a sensor bonded to a substrate in accordance with an embodiment of the present invention.

FIG. 3 is a top view of a sensor 10 bonded to a substrate 150 in accordance with an embodiment of the present invention. The sensor 10 is sensitive to forces in the orthogonal X, Y, and Z directions. The X, Y, and Z axes form an orthonormal basis that spans three-dimensional space. An orthonormal basis includes three vectors (e.g., X, Y, Z) that are orthogonal to each other and each vector has a length of a unit. The sensor 10 includes a vertically orientated chip 300 and two horizontally orientated chips 401 and 402. In the embodiment shown in FIG. 3, the vertically orientated chip 300 is sensitive to forces in the Z direction, the horizontally orientated chip 401 is sensitive to forces in the X direction, and the horizontally orientated chip 402 is sensitive to forces in the Y direction.

The first horizontally orientated chip 401 has a plurality of chip-solder pads represented generally at 411 viewed as dashed ellipses through the first horizontally orientated chip 401. The plurality of solder pads 202 (viewed through the first horizontally orientated chip 401) are arranged to align with chip-solder pads 411 on the horizontally orientated chip 401. The first horizontally orientated chip 401 can be flip-chip bonded to the substrate 150 by a solder reflow process once the solder pads 202 are aligned to the chip-solder pads 411 on the horizontally orientated chip 401.

Likewise, the second horizontally orientated chip 402 has a plurality of chip-solder pads represented generally at 412 viewed as dashed ellipses through the horizontally orientated chip 402. The plurality of solder pads 203 (viewed through the second horizontally orientated chip 402) are arranged to align with chip-solder pads 412 on the second horizontally orientated chip 402. The second horizontally orientated chip 402 can be flip-chip bonded to the substrate 150 by a solder reflow process once the solder pads 203 are aligned to the chip-solder pads 412 on the second horizontally orientated chip 402.

In one implementation of this embodiment, the two horizontally orientated chips 401 and 402 are a single chip that is sensitive to forces in both the X direction and the Y direction. In another implementation of this embodiment, the two horizontally orientated chips 401 and 402 are a single chip that is sensitive to forces in either the X direction or the Y direction. In these two latter cases, the second plurality of solder pads are arranged to align with chip-solder pads on the horizontally orientated chip. The horizontally orientated chip can be flip chip bonded to the substrate 150 by a solder reflow process once the solder pads are aligned to the chip-solder pads on the two-dimensionally sensitive horizontally orientated chip. In yet another implementation of this embodiment, the sensor 10 is a three-dimensional accelerometer. In yet another implementation of this embodiment, the sensor 10 is a three-dimensional magnetic sensor.

As shown in FIG. 3, each of a plurality of chip-solder pads represented generally at 310 formed along a front-bonding edge of the front surface of the vertically orientated die 300 is associated with a respective one of the plurality of solder pads 112 on the substrate 150. As defined herein, the front bonding edge is the edge of the vertically orientated die 300 along which electrical connections are made. The circuits (not shown) on the vertically orientated die 300 are electrically connected to the chip-solder pads 310 on the vertically orientated die 300 as required to operate. The vertically orientated die 300 is placed between the plurality of solder pads 112 and the solder bar 100 so that each of the plurality of chip-solder pads 310 is aligned with the associated one of the plurality of solder pads 112. This alignment is required to provide the electrical connections (after the reflow process described below) between circuits (not shown) in or on the substrate 150 and the vertically orientated die 300.

Figure 4:
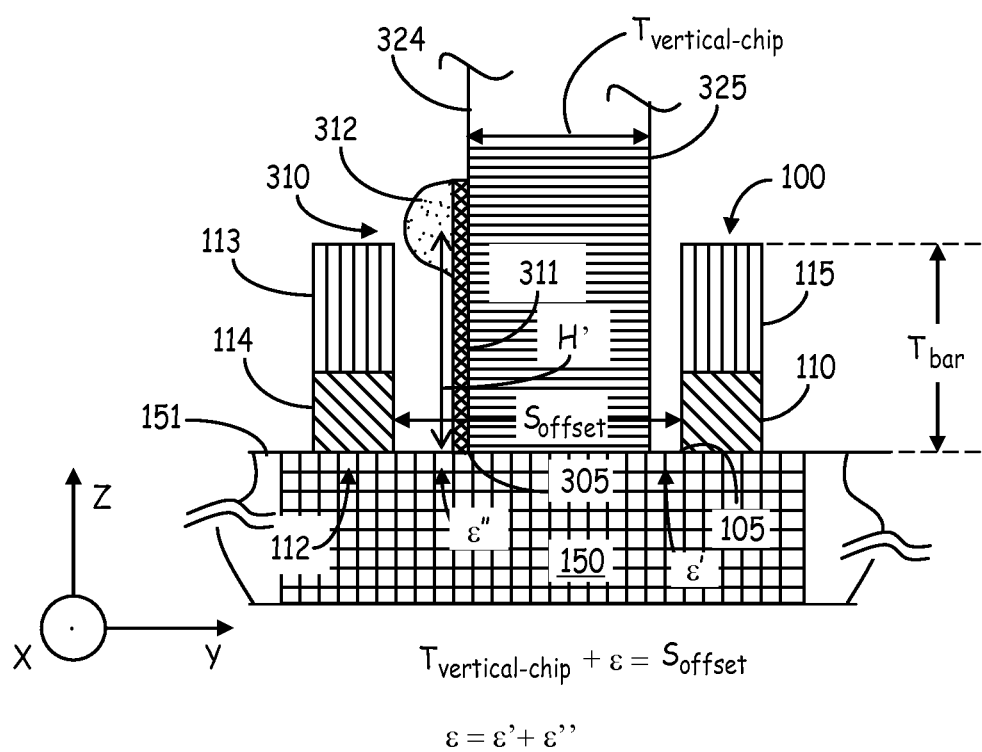
FIG. 4 is an enlarged cross-section view of a vertically orientated chip of FIG. 3 mounted on the substrate in accordance with the present invention.

FIG. 4 is an enlarged cross-section view of the vertically orientated chip 300 of FIG. 3 mounted on the substrate 150 in accordance with the present invention. The plane upon which the cross-section view of FIG. 4 is taken is indicated by section line 4-4 in FIG. 3. The vertically orientated chip is also referred to herein as a "chip to be vertically orientated," "vertically orientated die," "Z-axis sensor," or "vertically sensitive sensor." The terms "chip" and "die" are used interchangeably herein.

FIG. 4 shows relative positions of an exemplary metal bar 110 and an exemplary solder paste layer 115 that form the solder bar 100 adjacent to the back surface 325 of the vertically orientated chip 300. FIG. 4 also shows relative positions of an exemplary metal pad 114 and an exemplary solder paste layer 113 that form the solder pad 112 adjacent to the front surface 324 of the vertically orientated chip 300. The thickness $T_{bar}$ of the solder bar 100 is about equal to the thickness of the solder pad 112. FIG. 4 also shows relative positions one of the chip-solder pads 310 on the front surface 324 of the vertically orientated chip 300 aligned to the associated solder pad 112 on the substrate 150. The chip-solder pads 310 include a solder paste bump 312 positioned on the metal bonding pad 311 that is formed along the front-bonding edge 305 of the vertically orientated chip 300. The metal bonding pads 311 extend from about the front-bonding edge 305 of the vertically orientated chip 300 by a distance at least great enough to allow for placement of the solder paste bumps 312 on the metal bonding pads 311.

For ease of viewing, the solder paste bump 312 is offset from a front-bonding edge 305 of the vertically orientated chip 300 by a bonding pad distance H' which is about equal to or slightly greater than the thickness of the solder pad 112. In one implementation of this embodiment, the solder paste bump 312 is placed very near to the substrate 150 so that it is positioned between the metal bonding pad 311 and the associated solder pad 112. The solder paste bump 312 is formed from lead-free type 6 solder or other types of solder that provide the required reflow characteristics described below. If the solder paste bump 312 and the solder paste layer 115 and 113 are formed from different types of solder, it is desirable for the different solder types to flow at about the same temperature or within an acceptable range of temperatures.

As shown in FIG. 4, the distance between the solder pads 112 and the long edge 105 of the solder bar 100 is $S_{offset}$. The distance $S_{offset}$ is equal to or slightly greater than the vertical-chip thickness of the vertically orientated chip 300 (referred to herein as thickness $T_{vertical-chip}$) so that the vertically orientated chip 300 fits between the plurality of solder pads 112 and the solder bar 100. For example, the distance $S_{offset}=T_{vertical-chip}+\epsilon$, where $\epsilon \ll T_{vertical-chip}$. The distance between the solder pad 112 and the metal bonding pad 311 on the front surface 324 of the vertically orientated chip 300 is $\epsilon''$. The distance between the solder bar 100 and the back surface 325 of the vertically orientated chip 300 is $\epsilon'$. Thus, the difference between the distance $S_{offset}$ and the distance $T_{vertical-chip}$ is $\epsilon=\epsilon''+\epsilon'$.

When reference is made herein to the vertically orientated die 300 having a thickness $T_{vertical-chip}$ equal to or slightly less than the offset-spacing $S_{offset}$, the thickness $T_{vertical-chip}$ includes the thickness of the metal bonding pads 311. In some cases, the thickness $T_{vertical-chip}$ includes the thickness of the metal bonding pads 311 and the thickness of the solder paste bump 312.

Figure 5:
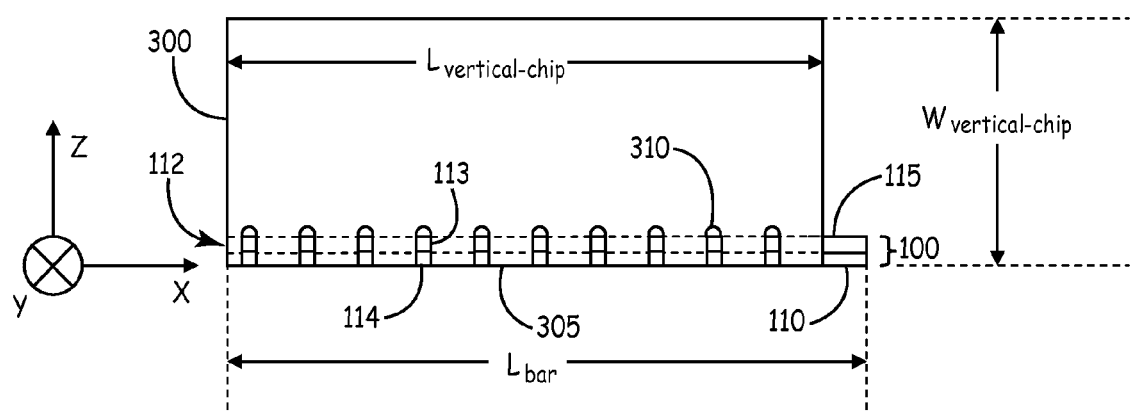
FIG. 5 is a front view of a vertically orientated chip mounted on a substrate in accordance with an embodiment of the present invention.

FIG. 5 is a front view of a vertically orientated chip 300 mounted on a substrate 112. This view shows relative positions the chip-solder pads 310 aligned to an associated one of the plurality of solder pads 112 on the substrate 150. The metal bar 110 and the solder paste layer 115 that form the solder bar 100 adjacent to the back surface 325 of the vertically orientated chip 300 are seen as dashed lines through the vertically orientated chip 300. The length $L_{bar}$ of the solder bar 100 is shown as longer than the length $L_{vertical-chip}$ of the vertically orientated chip 300. In one implementation of this embodiment, the length $L_{bar}$ of the solder bar 100 about equal to the length $L_{vertical-chip}$ of the vertically orientated chip 300. In another implementation of this embodiment, the solder bar 100 is two or more bars that are both or all linearly aligned to each other. In this case, two or more bars all together are about the length $L_{vertical-chip}$ of the vertically orientated chip 300.

In the embodiment shown in FIG. 5, the length $L_{vertical-chip}$ (in the X direction) of the vertically orientated chip 300 is much greater than the width $W_{vertical-chip}$ (in the Z direction) of the vertically orientated chip 300. This permits the vertically orientated chip 300 to be sufficiently sensitive in the Z direction while sensor 10 (FIG. 3) has a relatively flat three-dimensional configuration. Packaging constraints for sensors often require this flat configuration. Specifically, the length by width by height ($L_{vertical-chip} \times W_{vertical-chip} \times T_{vertical-chip}$) of vertically orientated chip 300 and the length by width by height (i.e., volume) of each horizontal sensor is intended to be as small as possible without sacrificing significant performance of the sensor.

Figure 6A:
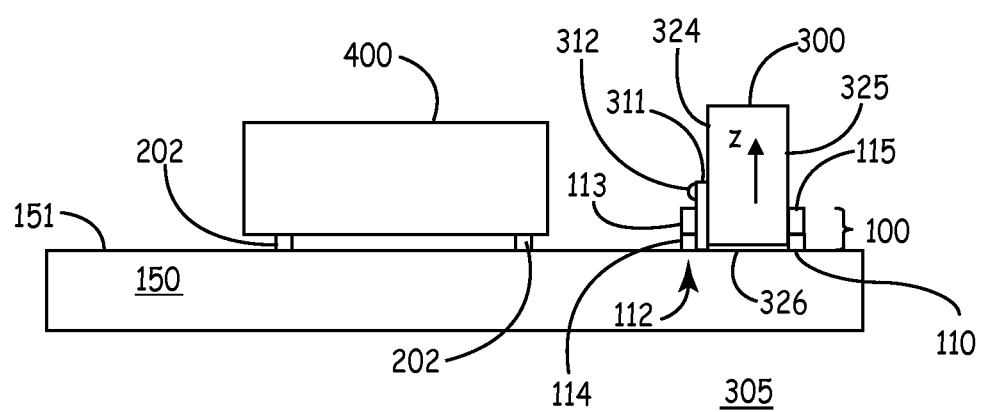
FIGS. 6A and 6B are side views of a vertically orientated chip and a horizontally orientated chip on a substrate prior to reflow and after reflow, respectively, in accordance with an embodiment of the present invention.
Figure 6B:
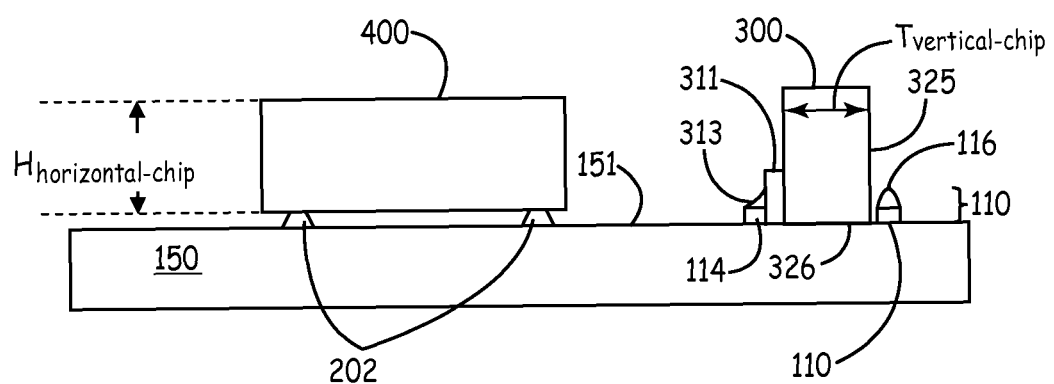
Figure 7:
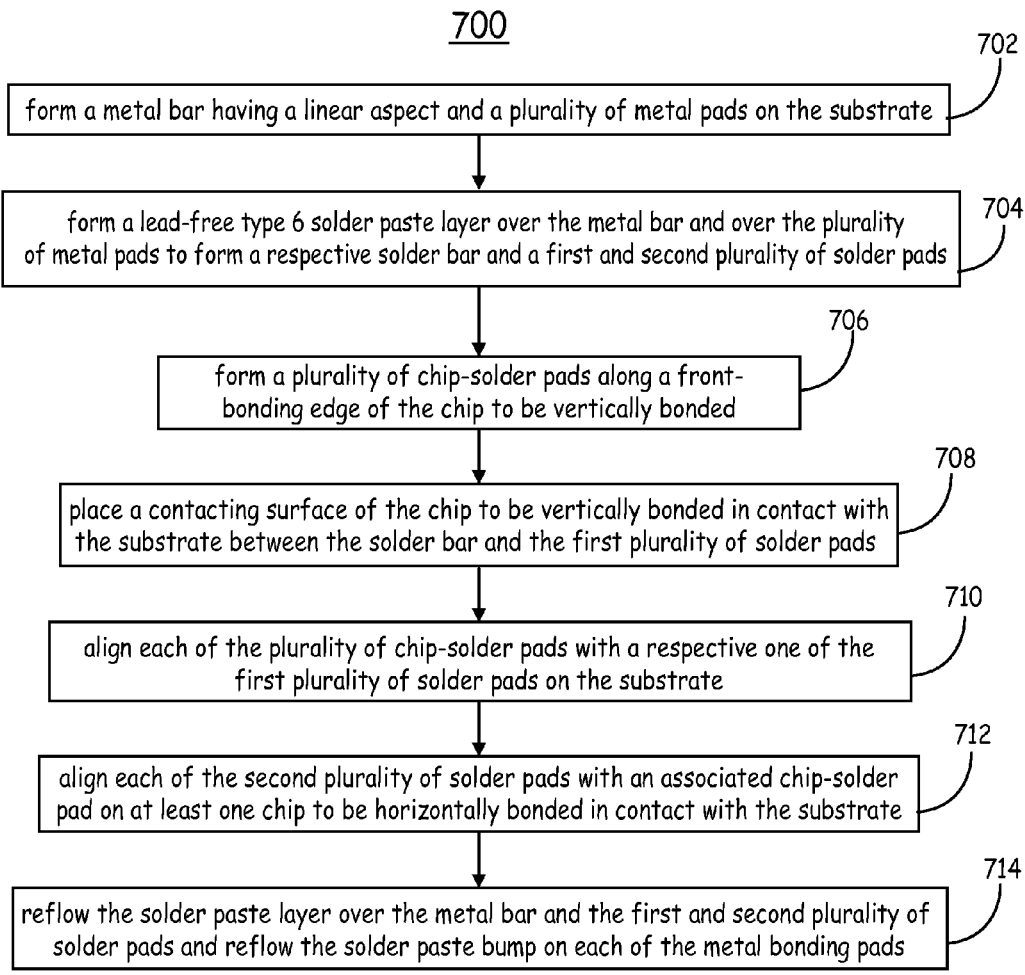
FIG. 7 is a flow diagram of a method to vertically bond a chip to a substrate.

FIGS. 6A and 6B are side views of a vertically orientated chip 300 and a horizontally orientated chip 400 on a substrate 150 prior to reflow and after reflow, respectively, in accordance with the present invention. FIG. 7 is a flow diagram of a method 700 to vertically bond a chip 300 to a substrate 150. The method 700 is described with reference to the FIGS. 3, 4, 6A and 6B.

At block 702, a metal bar 110 having a linear aspect is formed on the substrate 150 and a plurality of metal pads 114 are formed on the substrate 150. The metal bar 110 has a linear aspect extending along the long edge 105 of the metal bar 110 that has the length $L_{bar}$. Since the length $L_{bar}$ is much greater than the width $W_{bar}$ and the thickness $T_{bar}$ of the metal bar 110, the metal bar 110 is described as having a linear aspect. Each of the first plurality of metal pads 114 are offset from a long edge 105 the metal bar 110 by an offset-spacing $S_{offset}$. The second plurality of metal pads 114 are arranged for bonding to the horizontally sensitive sensors.

At block 704, a solder paste layer 115 is formed over the metal bar 110 to form a solder bar 100 and a solder paste layer 113 is formed over the metal pads 114 to form a first plurality of solder pads 112 and second plurality of solder pads 202 and/or 203. In one implementation of this embodiment, the solder paste layer 115 and solder paste layer 113 is screen printed over the metal bar 110 and the metal pads 114. Methods of screen printing solder paste are known by those skilled in the art. In another implementation of this embodiment, the solder paste layer 115 and solder paste layer 113 comprise lead-free type 6 solder paste.

In this manner, each of the plurality of solder pads 112 is offset from the inner edge 105 the solder bar 100 by an offset-spacing is $S_{offset}$ and the plurality of solder pads 202 and 203 (FIGS. 1, 2A, and 3) are formed as required for bonding the horizontally sensitive sensors on the substrate 150. The chip 300 to be vertically bonded to the substrate 150 has a thickness $T_{vertical-chip}$ fractionally less than the offset-spacing $S_{offset}$. As defined herein, "fractionally less than" is smaller than "1/10 less than." In another implementation of this embodiment, "fractionally less than" is about "1/20 less than." In yet another implementation of this embodiment, "fractionally less than" is about "1/30 less than." As is understandable, the offset-spacing $S_{offset}$ is fractionally greater than the thickness $T_{vertical-chip}$ of the vertically orientated chip.

Blocks 702 and 704 describe a method to prepare a substrate 150 for aligning and operably bonding a vertically orientated chip 300 to the substrate 150. The substrate 150 includes the connections (e.g., vias or trace lines) required to operably connect the vertically orientated chip 300 to other components in a system. In one implementation of this embodiment, the vertically orientated chip 300 is an accelerometer sensitive in the Z direction. In another implementation of this embodiment, the vertically orientated chip 300 is a magnetic sensor sensitive in the Z direction.

At block 706, a plurality of chip-solder pads 310 is formed along a front-bonding edge 305 of the chip 300 to be vertically orientated on the substrate 150. The chip-solder pads 310 are formed from the metal bonding pads 311 and the solder paste bump 312 (FIG. 4). A plurality of metal bonding pads 311 are formed along the front-bonding edge 305 of the vertically orientated chip 300 and the solder paste bump 312 is formed on each of the metal bonding pads 311. In one implementation of this embodiment, the solder paste bumps 312 are each screen printed on the metal bonding pads 311. In one implementation of this embodiment, the metal bonding pads 311 are copper that is about 1 micron thick and the solder paste bumps 312 are lead-free type 6 solder paste that is about 60 to 125 microns thick. When reference is made herein to the vertically orientated die 300 having a thickness $T_{vertical-chip}$ fractionally less than the offset-spacing $S_{offset}$, the thickness $T_{vertical-chip}$ includes the thickness of the metal bonding pads 311.

At block 708, a contacting surface 326 (FIGS. 6A and 6B) of the chip 300 to be vertically bonded is placed in contact with the top surface 151 of the substrate 150 between the solder bar 100 and the first plurality of solder pads 112. The contacting surface 326 is orthogonal to the sensitive axis of the vertically sensitive sensor 300. The contacting surface 326 is visible in FIG. 6A, since the vertically orientated chip 300 is still slightly removed from the substrate 150 and has not yet come into contact with the top surface 151 of the substrate 150.

At block 710, each of the plurality of chip-solder pads 310 along the front-bonding edge of the vertically orientated chip 300 is proximally aligned to one of the first plurality of solder pads 112. As defined herein, chip-solder pads 310 are proximally aligned to solder pads 112 when they are close enough to each other for a conductive contact to be formed between them when the solder in the chip-solder pads 310 is reflowed (melted) to contact with the reflowed solder paste in the solder paste layer 113. Each chip-solder pad 310 is associated with a respective one of the plurality of solder pads 112 on the substrate 150 so that each chip-solder pad 310 is aligned to an associated one of solder pads 112 when the one of the chip-solder pads 310 is aligned to an associated one of solder pads 112. For example, when an end solder pad 111 (FIG. 3) is aligned to an end chip-solder pad 350 (FIG. 3), all the chip-solder pads 310 are aligned to a respective one of the solder pads 112.

At block 712, each of the second plurality of solder pads 202 and 203 (FIG. 3) is aligned to an associated chip solder pad 411 and 412 on the at least one chip 401 and 402 to be horizontally bonded in contact with the substrate 112. This is an initial step in a flip-chip bonding process for the horizontally orientated chips 401 and 402.

At block 714, the solder paste layer 115 is reflowed over the metal bar 110 while the solder paste layer 113 is reflowed over the first plurality of metal pads 114. At the same time, the solder paste bump 312 reflows (melts) to contact the melting solder paste layer 113 on each of the metal pads 114. As shown in FIG. 6B, the reflowed solder paste layer 116 (solder paste layer 115 before reflow) forms a cap-like shape over the metal bar 110. The solder paste bumps 312 on each of the metal bonding pads 311 melts into the solder paste layer 113 over the metal pad 114 to form the metal contact 313 (FIG. 6B) between the metal pad 114 on the substrate 150 and the metal bonding pads 311 on the vertically orientated chip 300. In this manner, an electrical contact is established between circuits (not shown) on and/or in the substrate 150 and circuits in and/or on the vertically orientated chip 300.

Surface tension holds the solder melted from the solder paste layer 115 on the top of the metal bar 110. In this manner, the solder paste layer 116 does not creep between the contacting surface 326 of the chip 300 and the top surface 151 of the substrate 150. This type of reflow is possible with type 6 solder. In this manner, the vertically orientated chip 300 is electrically contacted to the substrate 150 in a vertical orientation without any of the solder seeping between the contacting surface 326 of the chip 300 and the top surface 151 of the substrate 150. This is advantageous, since any solder that would seep under the contacting surface 326 would tilt the vertically orientated chip 300 so the back surface 325 would not be orthogonal to the top surface 151 of the substrate 150.

Thus, the solder bar 100 is used during the alignment of the vertically orientated chip 300 to hold the vertically orientated chip 300 in place before reflow. Advantageously, the solder paste on the solder bar 100 melts during the reflow without changing the vertical orientation of the vertically orientated chip 300, since the solder bar 100 does not touch or move the vertically orientated chip 300 during the reflow process.

In this manner, the vertically orientated chip 300 is operably attached in a vertically orientated direction with respect to the top surface 151 of the substrate 150 so that the top surface 151 of the substrate 150 is orthogonal the sensitive direction (e.g., Z) of the vertically sensitive sensor 300 when the contacting surface 326 of the vertically sensitive sensor 300 contacts the top surface 151 of the substrate 150. In the embodiments shown in FIGS. 5, 6A and 6B, the vertically orientated chip 300 has a length $L_{vertical-chip}$, a width $W_{vertical-chip}$, and a thickness $T_{vertical-chip}$, such that the length $L_{vertical-chip}$ is much greater than the width $W_{vertical-chip}$, and the length $L_{vertical-chip}$ is much greater than the thickness $T_{vertical-chip}$ so that the mounted vertically orientated chip 300 extends from the top surface 151 of the substrate 150 by less than twice the height $H_{horizontal\ chip}$ of the at least one horizontally orientated chip 400. In other embodiments, the mounted vertically orientated chip 300 extends from the top surface 151 of the substrate by less than thrice, or four times the height $H_{horizontal\ chip}$ of the at least one horizontally orientated chip 300. This permits a relative low profile three-dimensional sensor 10 to be operationally mounted on a substrate 150. The substrate includes connections (not shown) as required to transmit the signals from the vertically sensitive sensor 300 and the at least one horizontally orientated chip 400 to processors or other devices as required by a system incorporating the vertically sensitive sensor 300 and the at least one horizontally orientated chip 400.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method to vertically bond a chip to a substrate, the method comprising:
    forming a metal bar having a linear aspect on the substrate;
    forming a first solder paste layer over the metal bar to form a solder bar;
    forming a plurality of metal pads on the substrate; and
    forming a second solder paste layer over the plurality of metal pads to form a plurality of solder pads on the substrate, each of the plurality of solder pads being offset from a long edge of the solder bar by an offset-spacing, wherein the chip to be vertically bonded to the substrate has a vertical-chip thickness fractionally less than the offset-spacing, wherein the chip to be vertically bonded fits between the plurality of solder pads and the solder bar, wherein the solder bar enables alignment of the chip to be vertically bonded;
    bonding the chip to the substrate, wherein the chip is vertically oriented between the plurality of metal pads and the solder bar, wherein the solder bar contacts and holds the chip in a vertical orientation before solder reflow and the solder bar does not touch the chip after the solder reflow.

2. The method of claim 1, wherein forming the first solder paste layer comprises forming a lead-free type 6 solder paste layer over the metal bar.

3. The method of claim 1, wherein bonding the chip to the substrate comprises:
    forming a plurality of chip-solder pads along a front-bonding edge of the chip to be vertically bonded, each chip-solder pad associated with a respective one of the plurality of solder pads on the substrate; and
    placing a contacting surface of the chip to be vertically bonded in contact with a top surface of the substrate between the solder bar and the plurality of solder pads on the substrate, wherein each of the plurality of chip-solder pads along the front-bonding edge of the chip is proximally aligned to a respective one of the plurality of solder pads.

4. The method of claim 3, wherein the chip is a vertically sensitive sensor, and wherein the contacting surface of the chip to be vertically bonded is orthogonal to a sensitive direction of the vertically sensitive sensor.

5. The method of claim 3, wherein forming the plurality of chip-solder pads comprises:
    forming a plurality of metal bonding pads along the front-bonding edge of the chip; and
    depositing a solder paste bump on each of the metal bonding pads.

6. The method of claim 5, wherein bonding the chip to the substrate comprises:
   reflowing the first solder paste layer over the metal bar; and
   reflowing the second solder paste layer over the plurality of metal pads; and
   reflowing the solder paste bump on each of the metal bonding pads of the plurality of chip-solder pads, wherein the reflowed solder paste bumps contact an associated one of the plurality of solder pads on the substrate.

7. The method of claim 3, further comprising aligning each of the plurality of chip-solder pads with the respective one of the plurality of solder pads.

8. The method of claim 1, wherein the plurality of solder pads comprise a first plurality of solder pads, the method further comprising forming a second plurality of solder pads on the substrate, the second plurality of solder pads configured to align with chip-solder pads on at least one chip to be horizontally bonded to the substrate.

9. The method of claim 8, wherein forming a plurality of metal pads on the substrate comprises forming a first plurality of metal pads on the substrate, wherein forming a second plurality of solder pads on the substrate comprises:
   forming a second plurality of metal pads on the substrate; and
   forming a third solder paste layer over the second plurality of metal pads to form a plurality of solder pads on the substrate.

10. The method of claim 1, wherein forming the first solder paste layer over the metal bar comprises screen printing the first solder paste layer over the metal bar, and wherein forming the second solder paste layer over the plurality of metal pads comprises screen printing the second solder paste layer on the plurality of metal pads.

* * * * *